(12) United States Patent
Huang et al.

(10) Patent No.: US 8,169,803 B2
(45) Date of Patent: *May 1, 2012

(54) POWER TRANSISTOR CHIP WITH BUILT-IN JUNCTION FIELD EFFECT TRANSISTOR AND APPLICATION CIRCUIT THEREOF

(75) Inventors: Chih-Feng Huang, Chupei (TW); Kuo-Chin Chiu, Xinfeng Township (TW)

(73) Assignee: Richtek Technology Corp., ChuPei (TW)

( * ) Notice: Subject to any disclaimer, the term of this patent is extended or adjusted under 35 U.S.C. 154(b) by 376 days.

This patent is subject to a terminal disclaimer.

(21) Appl. No.: 12/427,164

(22) Filed: Apr. 21, 2009

(65) Prior Publication Data

US 2010/0165685 A1 Jul. 1, 2010

(30) Foreign Application Priority Data

Dec. 26, 2008 (TW) .............................. 97150938 A

(51) Int. Cl.
*H02M 3/335* (2006.01)
*H02M 7/21* (2006.01)

(52) U.S. Cl. ..................... 363/49; 363/21.15; 363/21.16; 363/147

(58) Field of Classification Search ............... 363/21.02, 363/21.12, 21.15, 21.16, 97, 147

See application file for complete search history.

(56) References Cited

U.S. PATENT DOCUMENTS

| | | | |
|---|---|---|---|
| 6,775,164 B2 * | 8/2004 | Wong et al. | 363/147 |
| 6,888,203 B2 * | 5/2005 | Liaw et al. | 257/401 |
| 7,667,992 B2 * | 2/2010 | Wong et al. | 363/147 |
| 7,782,637 B2 * | 8/2010 | Selgi et al. | 363/49 |
| 2008/0073675 A1 * | 3/2008 | Cheng et al. | 257/272 |

* cited by examiner

*Primary Examiner* — Gary L Laxton

(57) ABSTRACT

A power transistor chip and an application circuit thereof have a junction field effect transistor to act as a start-up circuit of an AC/DC voltage converter. The start-up circuit can be turned off after the PWM circuit of the AC/DC voltage converter operates normally to conserve the consumption of the power. Besides, the junction field effect transistor is built in the power transistor chip. Because the junction field effect transistor is fabricated with the same manufacturing process as the power transistor, it is capable of simplifying the entire process and lowering the production cost due to no additional mask and manufacturing process.

8 Claims, 4 Drawing Sheets

POWER TRANSISTOR CHIP WITH BUILT-IN JUNCTION FIELD EFFECT TRANSISTOR AND APPLICATION CIRCUIT THEREOF

BACKGROUND OF THE INVENTION

1. Field of the Invention

The present invention is related to a voltage regulator circuit and particularly to a power transistor chip with a function field effect transistor (JEFT) built therein and an AC/DC voltage converter using the power transistor chip.

2. Brief Description of the Related Art

Due to the semiconductor technology being developed progressively, the digital products such as the computer and the peripherals thereof are capable of being upgraded continuously. The fast change of the manufacturing process for the semiconductor results in a variety of demands for the power source of the integrated circuit (IC) employed in the computer and the peripherals thereof. Hence, various combinations of voltage regulators using such as the boost converter and the buck converter to meet the need of different power sources of the integrated circuit become one of the most important factors to offer versatile digital products. The AC/DC voltage converter is widely taken as the primary stage circuit of the voltage regulator circuit because it is capable of converting the AC power input to the needed steady direct power output.

Referring to FIG. 1, a circuit diagram of the conventional AC/DC voltage converter is illustrated. The AC/DC voltage converter 10 includes a bridge type rectifying circuit 11, a power transistor chip 12, a pulse width modulation (PWM) circuit 13, a start-up circuit 14, a transformer circuit 15, a filtering and feedback circuit 16 and a working power circuit 17. The pulse width modulation circuit 13 produces the modulated PWM signal to control and output the direct power output $V_o$ according to the magnitude of the feedback voltage of the direct power output $V_o$. However, the pulse width modulation circuit 13 usually is driven by a low voltage direct power and there is no direct power available for operating the pulse width modulation circuit 13 at the time of the AC/DC voltage converter 10 initiating the work thereof. Therefore, it is necessary to use the start-up circuit 14 and the working power circuit 17 to supply the successive power needed by the pulse width modulation circuit 13.

When the AC/DC voltage converter 10 initiates the work thereof, the output terminal of the bridge type rectifying circuit 11 outputs a rippling direct power to the pulse width modulation circuit 13 via the resistance in the start-up circuit 14 for operating the pulse width modulation circuit 13. Then, the pulse width modulation circuit 13 performs the normal job thereof afterward according to the magnitude of the feedback voltage of the output direct power $V_o$ and produces the modulated PWM signal such that the time duration of ON and OFF of the power transistor can be controlled for outputting a steady direct power $V_o$. The working power circuit 17, which is connected to the transformer circuit 15, supplies more steady working power for the pulse width modulation circuit 13 performs the job thereof much steadily after the AC/DC voltage converter 10 is started up and outputs the steady direct power $V_o$.

Although the preceding way allows the AC/DC voltage converter to work normally, the start-up circuit 14 keeps in a state of supplying the power to the pulse width modulation circuit 13 unnecessarily. In order to improve the deficiency, the depletion metal oxide semiconductor field effect transistors (Depletion MOSFET) 221, 331 are employed instead to output a start-up signal st via the pulse width modulation circuit 23 or 33 to turn off the operation of the depletion metal oxide semiconductor field effect transistors 221, 331 respectively for conserving the power consumption.

The difference between FIG. 2 and FIG. 3 is in that the depletion metal oxide semiconductor field effect transistors 221, 331 are integrated in the power transistor chip 22 and the pulse width modulation circuit 33 respectively for starting up the AC/DC voltage converter. However, the manufacturing process of the chip becomes more complicated due to the additional process of the channel (N channel or P channel) of the depletion metal oxide semiconductor field effect transistors 221, 331.

SUMMARY OF THE INVENTION

Accordingly, an object of the present invention is to provide a power transistor chip and an AC/DC voltage converter using the power transistor chip, which has a junction field effect transistor built in the power transistor chip to act as a start-up circuit such that not only the power consumption is conserved but also no additional mask and process are involved for simplifying the manufacturing process and lowering the production cost.

In order to achieve the preceding object, the power transistor chip with a built-in junction field effect transistor according to the present invention is adaptable to the AC/DC voltage converter and comprises a first pin, a second pin, a third pin, a fourth pin, a fifth pin, a power transistor and a junction field effect transistor; wherein, the power transistor acts as a power switch of the AC/DC voltage converter and has a first source/drain, a second source/drain and a power transistor gate with the first source/drain coupling with the first pin, the second source/drain coupling with the second pin and the power transistor gate coupling with the third pin; and the junction field effect transistor acts as the start-up circuit of the AC/DC voltage converter and has a third source/drain, a fourth source/drain and a junction field effect transistor gate with the third source/drain coupling with said first pin, the fourth source/drain coupling with the fourth pin and the junction field effect transistor gate coupling with the fifth pin.

Further, the AC/DC voltage converter according to the present invention is capable of converting the AC power input to the steady DC power output and further comprises a bridge type rectifying circuit, a transformer circuit, a pulse width modulation circuit, a filtering and feedback circuit and a working power circuit in addition to the preceding power transistor chip with the built-in junction field effect transistor.

Wherein, the bridge type rectifying circuit has a power input terminal, which receives the AC power input, and a rectifying output terminal; the transformer circuit has a primary coil, a secondary coil and an auxiliary coil with the primary coil having an terminal coupling with the rectifying output terminal and another terminal coupling with the first pin of the power transistor chip, i.e., coupling with the first source/drain of the power transistor and the third source/drain of the junction field effect transistor.

The pulse width modulation circuit has a start-up power control terminal, a working power terminal, a pulse width modulation signal output terminal and a current sensing terminal with the start-up power control terminal coupling with the fifth pin to control ON and OFF of the junction field effect transistor, the working power terminal coupling with the fourth pin to receive a start-up power from the junction field effect transistor, the pulse width modulation signal output terminal coupling with the third pin to output a pulse width modulation signal according to the magnitude of a feedback voltage for modulating the DC power and the current sensing terminal coupling with the second pin to sense a current passing through the power transistor.

The working power circuit couples with the auxiliary coil and the working power terminal of the pulse width modulation circuit to supply a power needed by the pulse width modulation circuit at the time of the start-up power output by the junction field effect transistor being turned off by the pulse width modulation circuit; and the filtering and feedback circuit couple with the secondary coil to filter and output the steady DC power and supply a feedback voltage needed by the pulse width modulation circuit.

In short, a power transistor chip and an AC/DC voltage converter using the power transistor chip according to the present invention has a junction field effect transistor built in the power transistor chip to act as a start-up circuit of the AC/DC voltage converter. The start-up circuit can be turned off after the PWM circuit of the AC/DC voltage converter operates normally to conserve the consumption of the power. Besides, the junction field effect transistor is fabricated with the power transistor chip with the identical manufacturing process such that it is capable of simplifying the process and lowering the production cost due to no additional mask and manufacturing process.

BRIEF DESCRIPTION OF THE DRAWINGS

The detail structure, the applied principle, the function and the effectiveness of the present invention can be more fully understood with reference to the following description and accompanying drawings, in which:

FIG. 5 is a diagram illustrating the junction field effect transistor of the power transistor chip according to the present invention in a state of ON.

DETAILED DESCRIPTION OF THE INVENTION

Figure 1:
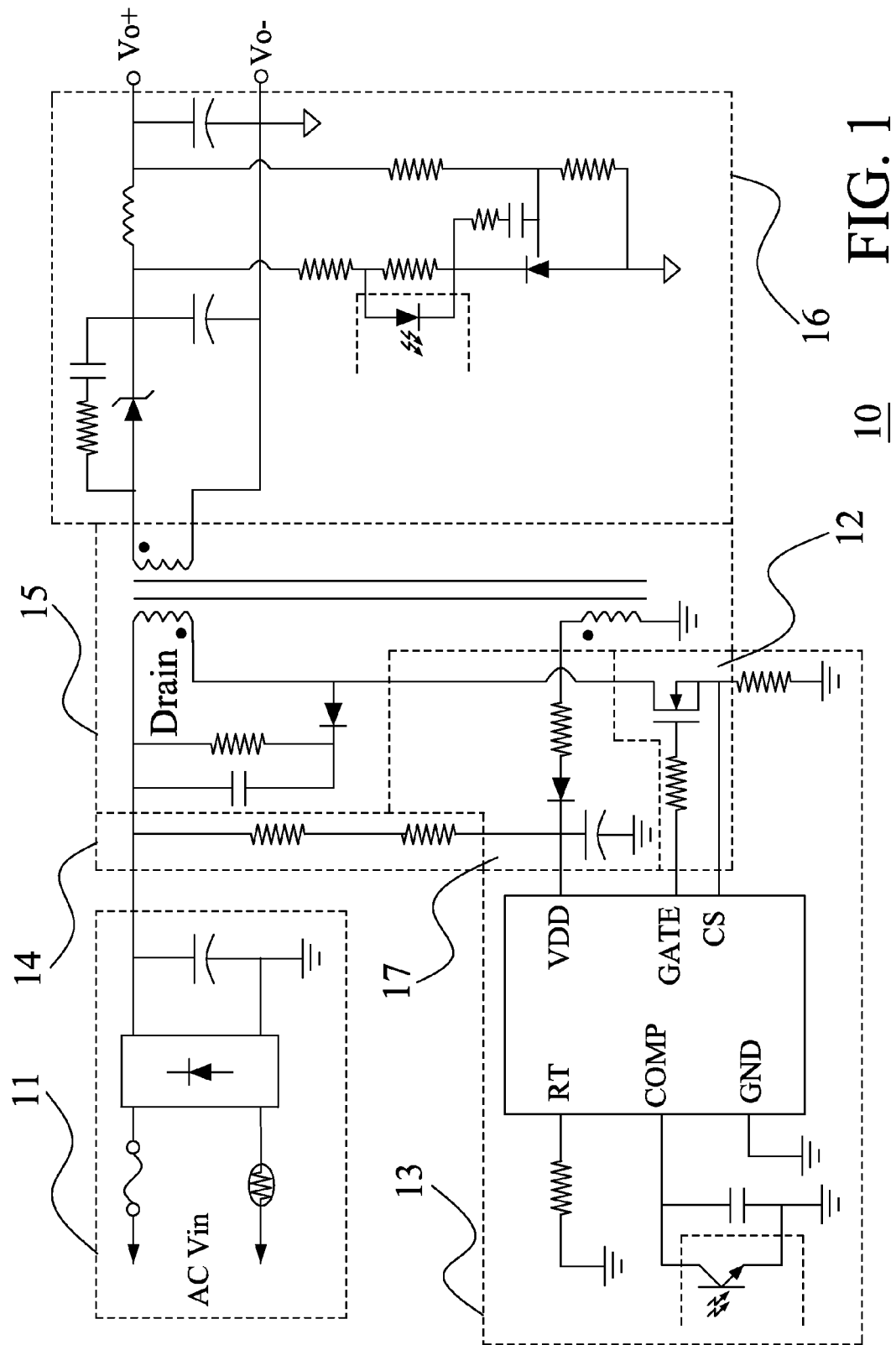
FIG. 1 is a circuit diagram illustrating the conventional AC/DC voltage converter.
Figure 2:
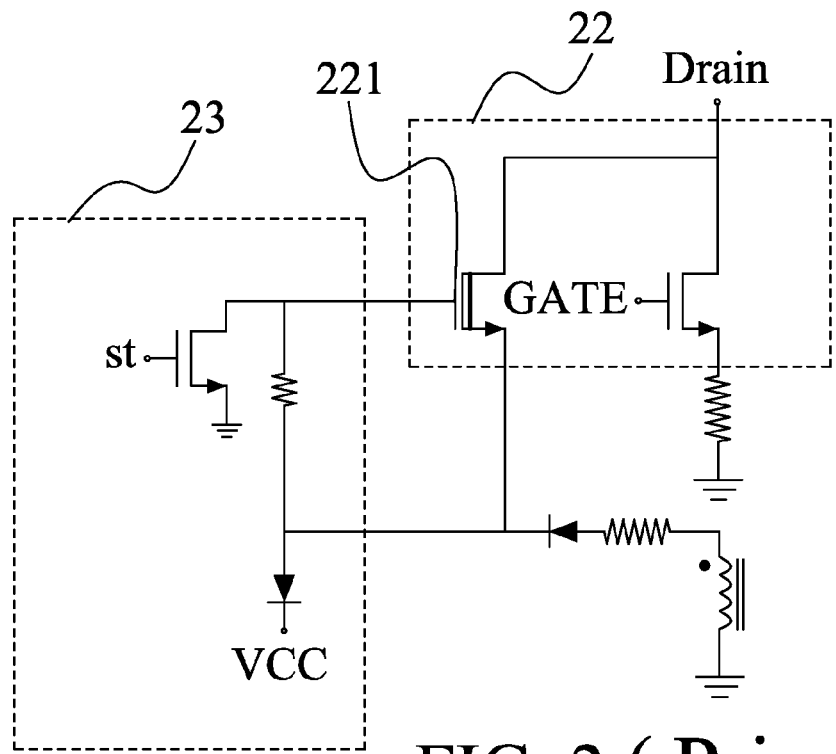
FIG. 2 is a circuit diagram illustrating the conventional AC/DC voltage converter employing the depletion metal oxide semiconductor field effect transistor (Depletion MOSFET) as a start-up circuit.
Figure 3:
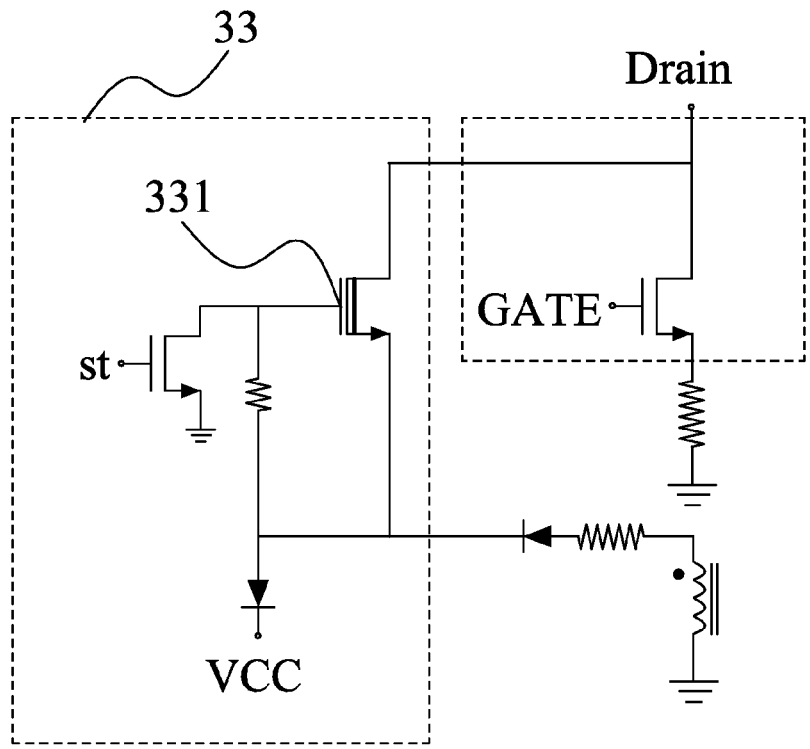
FIG. 3 is a circuit diagram illustrating another conventional AC/DC voltage converter similar to FIG. 2.
Figure 4:
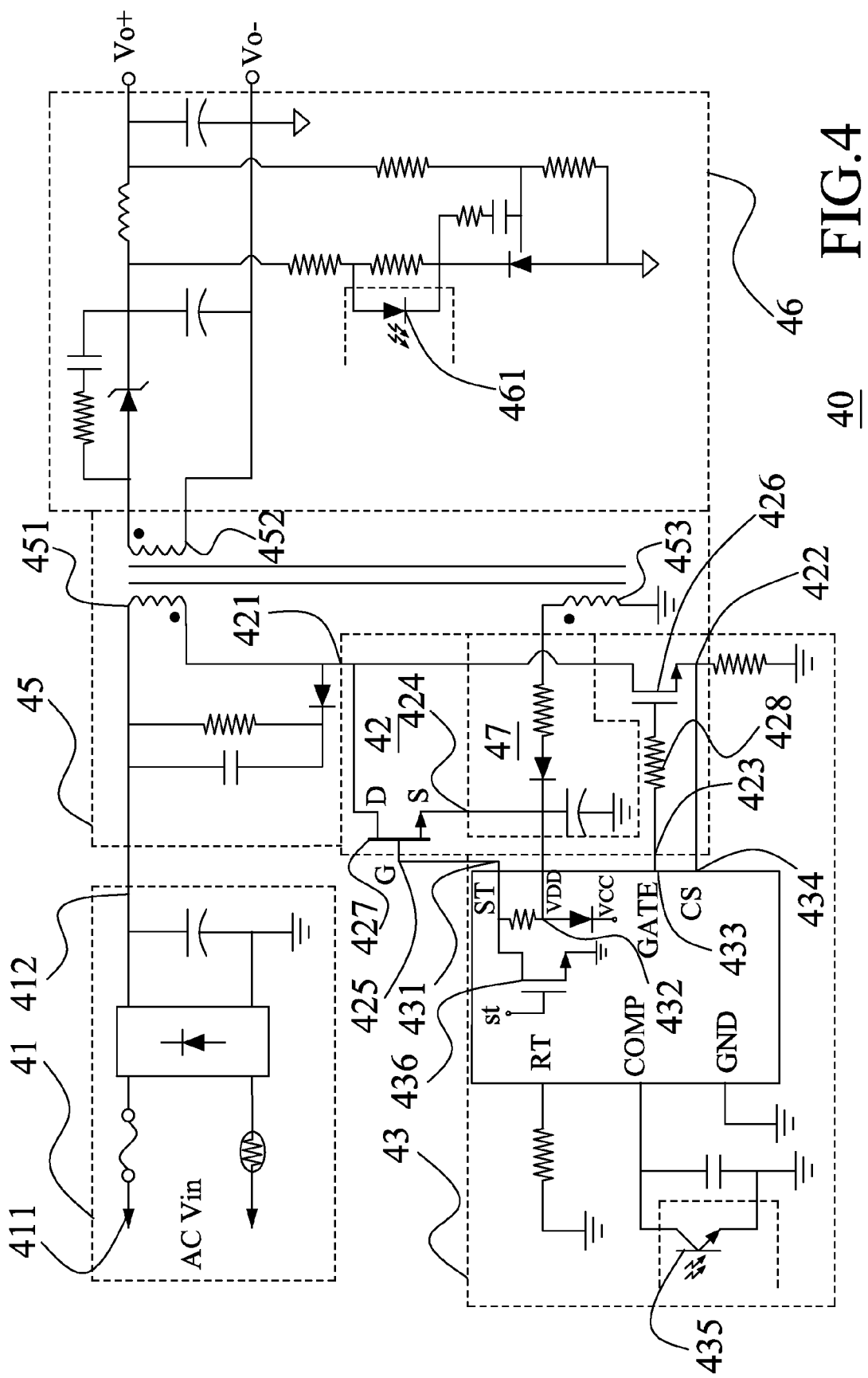
FIG. 4 is a circuit diagram illustrating an AC/DC voltage converter of a preferred embodiment according to the present invention.

Referring to FIG. 4, an AC/DC voltage converter of the preferred embodiment according to the present invention is illustrated. The AC/DC voltage converter 40 is capable of converting the AC input power $V_{in}$ coming from the power terminal 411 to a steady direct output voltage $V_o$. it can be seen in FIG. 4 that the AC/DC voltage converter 40 includes a bridge type rectifying circuit 41, a power transistor chip 42, a pulse width modulation circuit 43, a transformer circuit 45, a filtering and feed back circuit 46 and a working power circuit 47.

The power transistor chip 42 shown in FIG. 4 has a first pin 421, a second pin 422, a third pin 423, a fourth pin 244, a fifth pin 425, a power transistor 426 and a junction field effect transistor 427. The junction field effect transistor 427, which acts as the start-up circuit of the AC/DC voltage converter 40, is built in the power transistor chip 42 to simplify the manufacturing process of the chip arranged in the AC/DC voltage converter 40. Although the power transistor 426 and the junction field effect transistor 427 are exemplified with N-type metal oxide semiconductor field effect transistor and N-type junction field effect transistor and the resistance 428 connected to the gate of the power transistor 426 is built in the power transistor chip 42, persons skill in the art realize different type transistors such as the P-type metal oxide semiconductor field effect transistor or P-type junction field effect transistor can be adopted as well. Further, the built-in resistance 428 can be optionally integrated in a chip with the pulse width modulation circuit 43 instead of being included in the power transistor chip 42.

Wherein, the power transistor 426, which is a power switch of the AC/DC voltage converter 40, has the first source/drain coupling with the first pin 421, the second source/drain coupling with the second pin 422 and the gate coupling with the third pin 423. The junction field effect transistor 427 has the third source/drain D coupling with the first pin 421, the fourth source/drain S coupling with the fourth pin 424 and the gate G coupling with the fifth pin 425.

When the AC/DC voltage converter 40 is initiated to work, the bridge type rectifying circuit 41 receives the AC power input $V_{in}$ from the power source terminal 411 and rectifying the full wave of the AC power input $V_{in}$ such that a rippling direct power is output to the first pin 421 via a primary coil of the transformer circuit 451, which has an terminal coupling with the rectifying output terminal 412 of the rectifying circuit 41 and another terminal thereof coupling with the first pin 421 of the power transistor chip 42.

In order to supply the power to operate the pulse width modulation circuit 43, the working power terminal 432 of the pulse width modulation circuit 43 couples with the fourth pin 424 of the power transistor chip 42, i.e., the fourth source/drain S of the junction field effect transistor 427. Meanwhile, the start-up signal st output by the pulse width modulation circuit 43 is a low reference level signal and the built-in transistor 436 is still in a state of OFF such that the working power terminal 432 and the start-up power control terminal 431 of the pulse width modulation circuit 43 have the same potential as the VCC.

Besides, the start-up power control terminal 431 couples with the fifth pin 425 of the power transistor chip 42, i.e., the gate G of the junction field effect transistor 427. The working power terminal 432 couples with the fourth pin 424 of the power transistor chip 42, i.e. the fourth source/drain S of the junction field effect transistor 427. Hence, the fourth source/drain S of the junction field effect transistor 427 and the gate G of the junction field effect transistor 427 have the same potential as the VCC and are in a state of ON (See FIG. 5) such that the rippling direct power output by the bridge type rectifying circuit 41 can be transmitted to the fourth source/drain S of the junction field effect transistor 427.

Meanwhile, the pulse width modulation circuit 43 obtains the power for initiating the operation and starting up the work thereof. In addition, the pulse width modulation circuit 43 produces the modulated PWM signal in accordance with the magnitude of the feedback voltage of the direct power $V_o$ output by the AC/DC voltage converter 40 and the current of the power transistor chip 42, which is sensed from the current sensing terminal 434. Then, the modulated PWM signal is sent to the PWM signal output terminal 433 and transmitted to the gate of the power transistor of the power transistor chip 42 via the third pin 423 and the resistance 428 to control the time duration of ON and OFF of the power transistor 426 such that the AC/DC voltage converter 40 is capable of outputting a steady direct power $V_o$.

When the pulse width modulation circuit 43 initiates to work, the secondary coil 452 is induced a voltage, and then the voltage is filtered by the filtering and feedback circuit 46, which couples with the secondary coil 452, to output the steady direct power $V_c$. The reference feedback voltage needed by the pulse width modulation circuit 43 is obtained by means of the isolated detection of a light emitting diode 461 and an optical transistor 435 in the filtering and feedback circuit 46.

Figure 6:
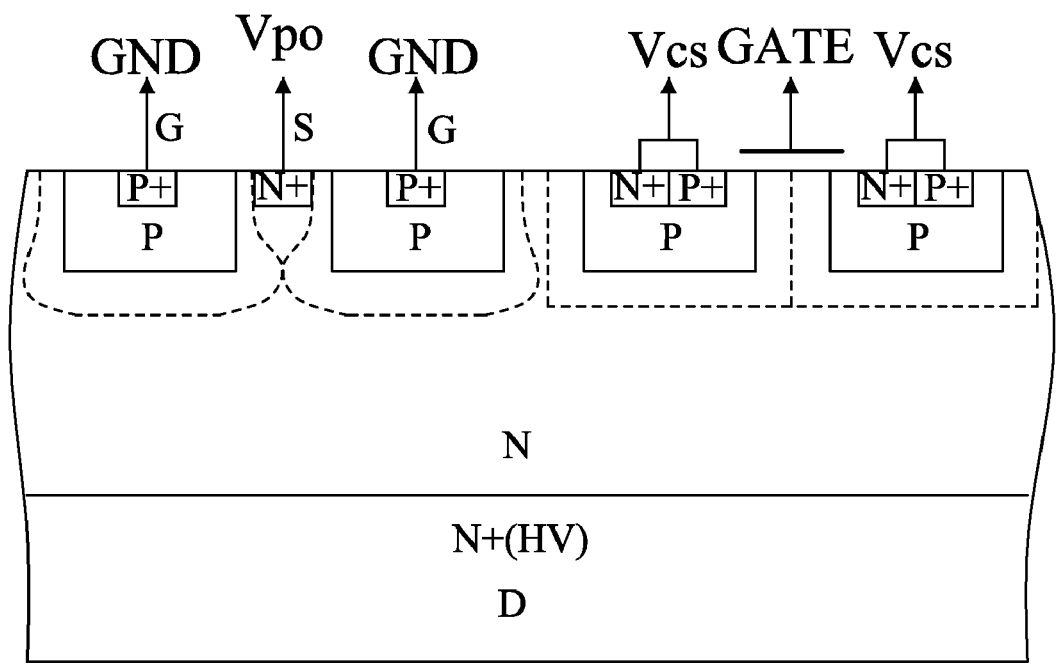
FIG. 6 is a diagram illustrating the junction field effect transistor of the power transistor chip according to the present invention in a state of OFF.

In addition, an auxiliary coil 453 of the transformer circuit 45 produces an induced voltage simultaneously and the induced voltage is filtered and transmitted to the working power terminal 432 by the working power circuit 47, which couples with the auxiliary coil 453. Under this circumstance, the steady working power supplied by the working power circuit 47 has been capable of meeting the need of much steadiness of the pulse width modulation such that the pulse width modulation circuit 43 raises the start-up signal st to a high reference level to activate the built-in transistor 436 for lowering the potential of the start-up control terminal 431 to the GND ground potential. In this way, it creates a reverse bias voltage between the fourth source/drain S and the gate G of the junction field effect transistor 427 to cause pinch-off as shown in FIG. 6 such that the start-up power output by the junction field effect transistor 427 is turned off after the steady working power supplied by the working power circuit 47 is capable of constantly offering the power required by the pulse width modulation circuit 43. In this way, the power consumption of the AC/DC voltage converter 40 is conserved significantly.

Figure 5:
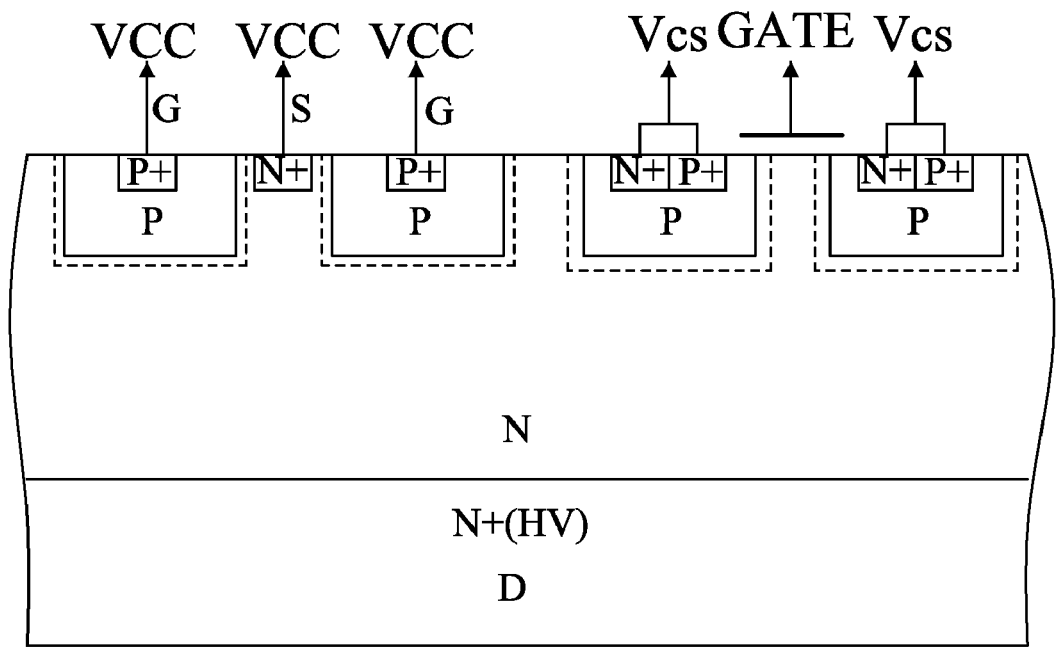

Referring to FIGS. 5 and 6, the power transistor chip 42 according to the preferred embodiment of the present invention provides the built-in junction field effect transistor 427 and the junction field effect transistor 427 has the similar doped structure as the power transistor 426 such that the identical manufacturing process is capable of being performed for fabricating both the power transistor 426 and the junction field effect transistor 427 with no additional mask and process. Therefore, the whole process is simplified and the production cost is lowered advantageously.

While the invention has been described with referencing to a preferred embodiment thereof, it is to be understood that modifications or variations may be easily made without departing from the spirit of this invention, which is defined by the appended claims.

What is claimed is:

1. A power transistor chip, which is adaptable to an AC/DC voltage converter, comprising:
   a first pin;
   a second pin;
   a third pin;
   a fourth pin;
   a fifth pin;
   a power transistor acting as a power switch of said AC/DC voltage converter and having a first source/drain, a second source/drain and a power transistor gate, wherein said first source/drain couples with said first pin, said second source/drain couple with said second pin and said power transistor gate couple with said third pin; and
   a junction field effect transistor acting as a start-up circuit of said AC/DC voltage converter and having a third source/drain, a fourth source/drain and a junction field effect transistor gate, wherein said third source/drain couples with said first pin, said fourth source/drain couples with said fourth pin and said junction field effect transistor gate couples with said fifth pin.

2. The power transistor chip as defined in claim 1 further comprises a resistance between said power transistor gate and said third pin.

3. The power transistor chip as defined in claim 1, wherein said power transistor is an N-type metal oxide semiconductor field effect transistor.

4. The power transistor chip as defined in claim 1, wherein said junction field effect transistor is an N-type junction field effect transistor.

5. An AC/DC voltage converter, which is capable of converting an AC power to a steady DC power, comprising:
   a power transistor chip further comprising:
      a first pin;
      a second pin;
      a third pin;
      a fourth pin;
      a fifth pin;
      a power transistor acting as a power switch of said AC/DC voltage converter and having a first source/drain, a second source/drain and a power transistor gate, wherein said first source/drain couples with said first pin, said second source/drain couple with said second pin and said power transistor gate couple with said third pin; and
      a junction field effect transistor acting as a start-up circuit of said AC/DC voltage converter and having a third source/drain, a fourth source/drain and a junction field effect transistor gate, wherein said third source/drain couples with said first pin, said fourth source/drain couples with said fourth pin and said junction field effect transistor gate couples with said fifth pin;
   a bridge type rectifying circuit having a power input terminal, which receives the AC power, and a rectifying output terminal;
   a transformer circuit having a primary coil, a secondary coil and an auxiliary coil, wherein said primary coil has an terminal coupling with said rectifying output terminal and another terminal coupling with said first pin;
   a pulse width modulation circuit having a start-up power control terminal, a working power terminal, a pulse width modulation signal output terminal and a current sensing terminal, wherein said start-up power control terminal couples with fifth pin to control ON and OFF of said junction field effect transistor, said working power terminal couples with said fourth pin to receive a start-up power from said junction field effect transistor, said pulse width modulation signal output terminal couples with said third pin to output a pulse width modulation signal according to the magnitude of a feedback voltage for modulating said DC power and said current sensing terminal couples with said second pin to sense a current passing through said power transistor;
   a working power circuit coupling with said auxiliary coil and said working power terminal to supply a power needed by said pulse width modulation circuit at the time of said start-up power being off by said pulse width modulation circuit; and
   a filtering and feedback circuit coupling with said secondary coil to filter and output the DC power and supply a feedback voltage needed by said pulse width modulation circuit.

6. The AC/DC voltage converter as defined in claim 5, wherein said power transistor chip further comprises a resistance between said power transistor gate and said third pin.

7. The AC/DC voltage converter as defined in claim 5, wherein said power transistor is an N-type metal oxide semiconductor field effect transistor.

8. The AC/DC voltage converter as defined in claim 5, wherein said junction field effect transistor is an N-type junction field effect transistor.

* * * * *